United States Patent
Yoneda et al.

(10) Patent No.: US 8,525,285 B2
(45) Date of Patent: Sep. 3, 2013

(54) SEMICONDUCTOR DEVICE WITH GROOVE STRUCTURE TO PREVENT MOLDING RESIN OVERFLOW OVER A LIGHT RECEIVING REGION OF A PHOTODIODE DURING MANUFACTURE

(75) Inventors: Shuji Yoneda, Kagoshima (JP); Masato Oishi, Kanagawa (JP); Tamotsu Shinohara, Kagoshima (JP); Shinji Watanabe, Kagoshima (JP); Koji Miyata, Kagoshima (JP); Seiji Fukae, Kagoshima (JP); Kenji Yamauchi, Kagoshima (JP); Yoichi Goto, Kagoshima (JP); Masakazu Baba, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/408,368

(22) Filed: Feb. 29, 2012

(65) Prior Publication Data

US 2012/0161271 A1 Jun. 28, 2012

Related U.S. Application Data

(62) Division of application No. 12/398,520, filed on Mar. 5, 2009, now Pat. No. 8,153,467.

(30) Foreign Application Priority Data

Mar. 27, 2008 (JP) ................................. 2008-084568

(51) Int. Cl.
*H01L 31/0203* (2006.01)
(52) U.S. Cl.
USPC ............. 257/434; 257/787; 438/64; 438/116; 438/127

(58) Field of Classification Search
None
See application file for complete search history.

(56) References Cited

U.S. PATENT DOCUMENTS

| 8,148,811 | B2 * | 4/2012 | Shinogi et al. | 257/704 |
| 2004/0051168 | A1 * | 3/2004 | Arai et al. | 257/678 |
| 2005/0041134 | A1 * | 2/2005 | Takayama | 348/340 |
| 2006/0091515 | A1 * | 5/2006 | Weng et al. | 257/680 |
| 2006/0220025 | A1 * | 10/2006 | Oh | 257/72 |
| 2007/0109439 | A1 * | 5/2007 | Minamio et al. | 348/340 |
| 2007/0176274 | A1 * | 8/2007 | Yoneda et al. | 257/680 |
| 2007/0222041 | A1 * | 9/2007 | Weng et al. | 257/666 |

FOREIGN PATENT DOCUMENTS

| JP | 63-197361 | 8/1988 |
| JP | 04-069958 | 3/1992 |
| JP | 2003-017715 | 1/2003 |
| JP | 2003-092394 | 3/2003 |
| JP | 2004-296584 | 10/2004 |
| JP | 2007-048795 | 8/2007 |
| WO | WO 2008023826 A1 * | 2/2008 |

OTHER PUBLICATIONS

Japanese Office Action issued on Aug. 28, 2012, in connection with counterpart JP Application No. 2008-084568.

* cited by examiner

*Primary Examiner* — Evan Pert
*Assistant Examiner* — Andres Munoz
(74) *Attorney, Agent, or Firm* — Dentons US LLP

(57) ABSTRACT

A semiconductor device having a substrate including a photodiode; a resin layer formed on an upper surface of the substrate, the resin layer not covering a light receiving region of the photodiode, the resin layer including at least one groove surrounding the light receiving region; and a molding resin portion formed by mold-sealing the photodiode with the resin layer thereon so as not to cover the light receiving region.

8 Claims, 7 Drawing Sheets

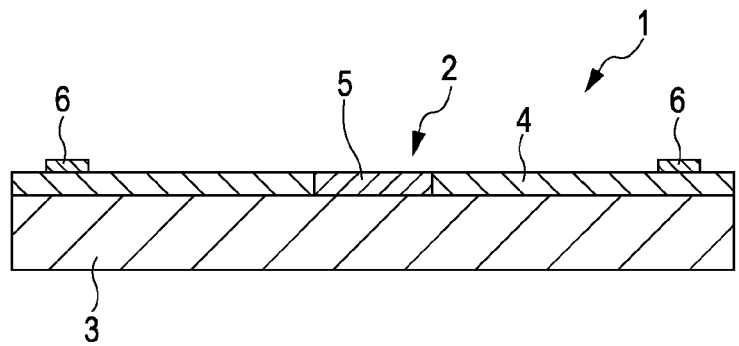
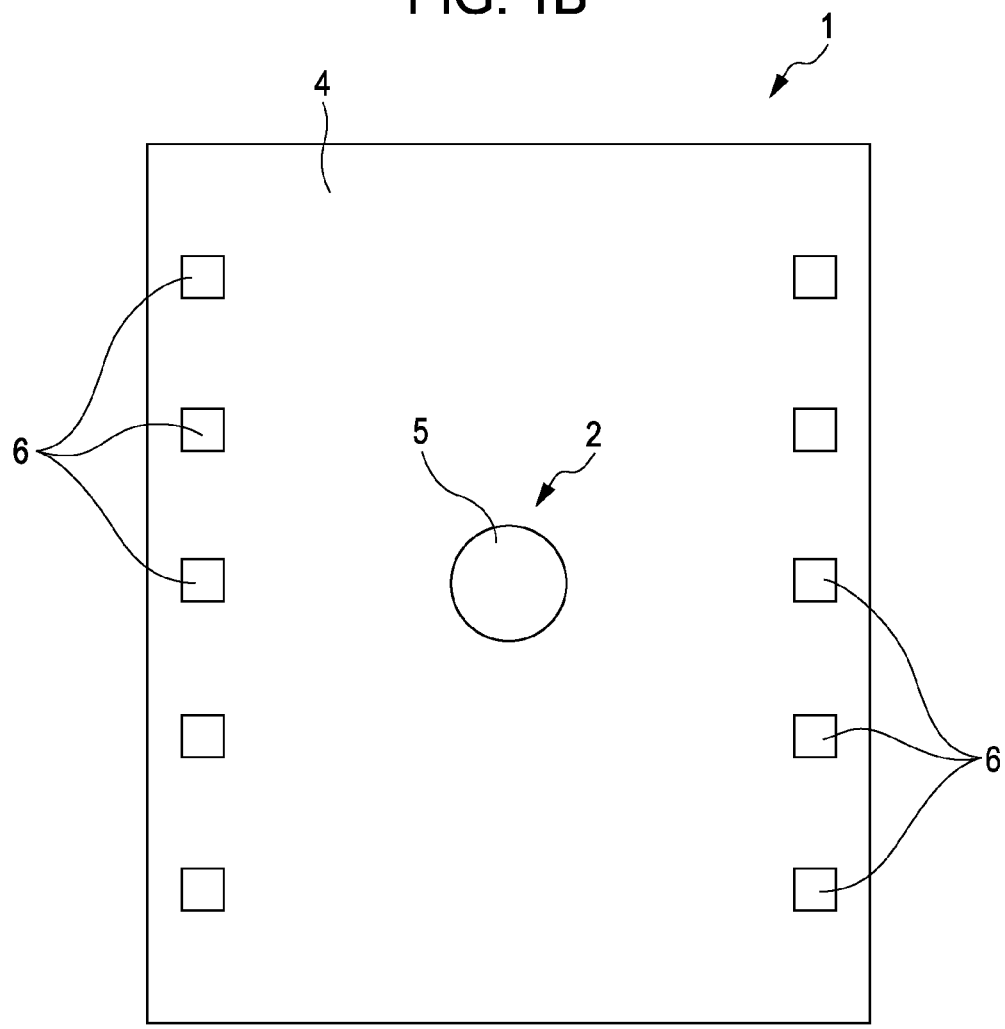

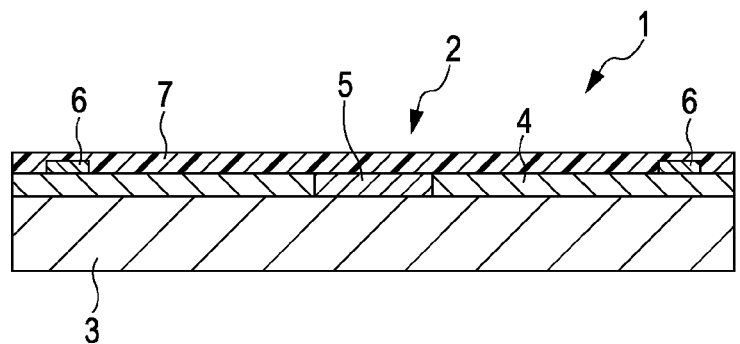
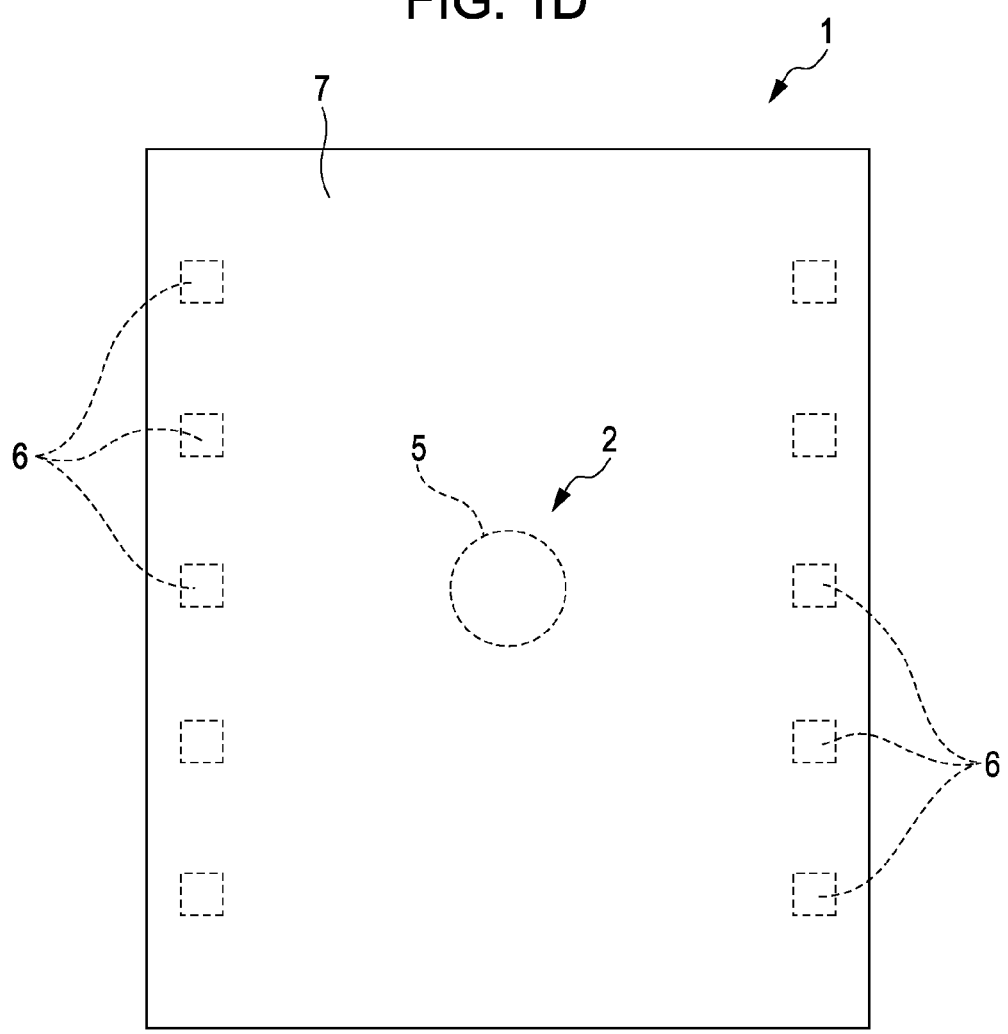

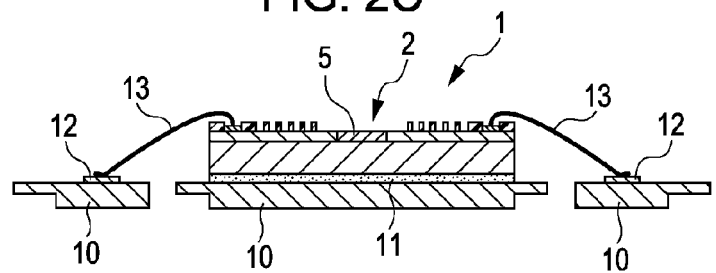
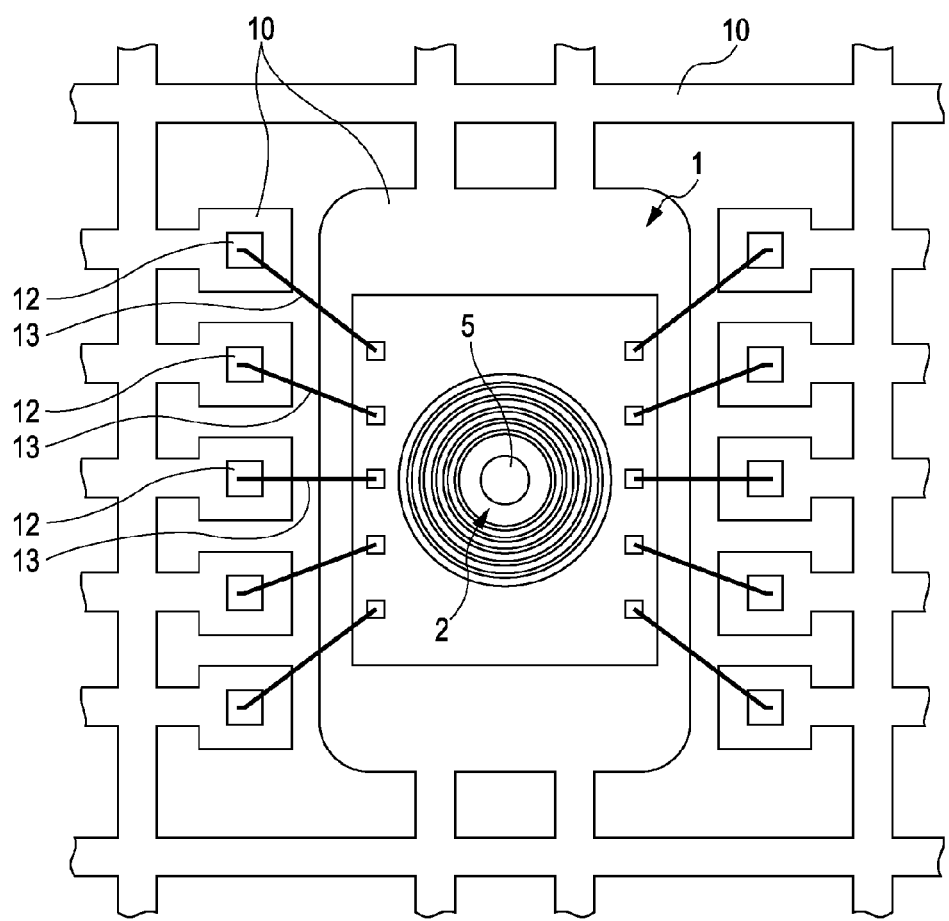

SEMICONDUCTOR DEVICE WITH GROOVE STRUCTURE TO PREVENT MOLDING RESIN OVERFLOW OVER A LIGHT RECEIVING REGION OF A PHOTODIODE DURING MANUFACTURE

RELATED APPLICATION DATA

This application is a division of U.S. patent application Ser. No. 12/398,520, filed Mar. 5, 2009, the entirety of which is incorporated herein by reference to the extent permitted by law. The present application claims the benefit of priority to Japanese Patent Application No. JP 2008-084568 filed in the Japanese Patent Office on Mar. 27, 2008, the entirety of which is incorporated by reference herein to the extent permitted by law.

BACKGROUND OF THE INVENTION

The present invention relates to a semiconductor device and a method for manufacturing the semiconductor device. In particular, the present invention relates to a semiconductor device that includes a photodiode and is mold-sealed with a molding resin such that the molding resin does not cover the light receiving region of the photodiode; and a method for manufacturing the semiconductor device.

Optical disc players are widely used for playing data recorded on optical discs such as CD-R (compact disc recordable) and DVD-R (digital versatile disk recordable).

Such an optical disc player includes an irradiation unit for irradiating a data recording surface of an optical disc with laser light (hereinafter, referred to as "light") for reading data; an optical pickup for receiving reflected light from the data recording surface that reflects the light from the irradiation unit and outputting data signals in accordance with the intensity of the received light; and a signal processing circuit for subjecting the data signals from the optical pickup to predetermined signal processing to produce signals that can be displayed with displays and the like.

The optical pickup has, in its light receiving portion, a photo detector integrated circuit (PDIC) including a photodiode. The photodiode functions as a photoelectric conversion element for converting received light into electric signals.

For the purpose of protecting semiconductor elements in such a PDIC from an externally applied impact, dust, moisture in the ambient atmosphere, and the like, the PDIC is packaged by sealing the PDIC with an epoxy resin or the like such that the light receiving region of a photodiode is not covered by the epoxy resin or the like (For example, see Japanese Unexamined Patent Application Publication No. 2003-017715).

A semiconductor device such as the packaged PDIC above is typically manufactured by bonding a substrate including semiconductor elements such as a photodiode onto a lead frame serving as a base; then conducting wire bonding by bonding the terminals of a PDIC to the terminals on the lead frame with metal wires; and subsequently loading the lead frame including the PDIC into a mold with a predetermined shape and filling the mold with a sealing resin liquefied by heating.

SUMMARY OF THE INVENTION

In manufacturing of semiconductor devices including photodiodes by the above-described method, when a mold is filled with a sealing resin, the resin can flow into the light receiving region of a photodiode. This is caused, for example, by variations in the shapes of the photodiodes.

Such a flowing of a sealing resin into the light receiving region of a photodiode can reduce the size of the light receiving region, thereby decreasing the sensitivity of the photodiode to light.

In the above-described method, a heated sealing resin is brought into direct contact with semiconductor elements such as a photodiode. The heat applied to the semiconductor elements in this step can alter the shape or the characteristics of the semiconductor elements in regions other than the light receiving region of the photodiode. This can degrade the characteristics of the semiconductor elements, thereby reducing device yield.

A method for manufacturing a semiconductor device according to an embodiment of the present invention includes the steps of: forming a resin layer on an upper surface of a substrate including a photodiode; forming, in the resin layer, an opening through which a surface of a light receiving region of the photodiode is exposed; forming at least one groove in the resin layer so as to surround the light receiving region; and subsequently mold-sealing the photodiode by loading the substrate into a mold and filling the mold with a molding resin.

In this method, the at least one groove may include a plurality of concentric circular grooves having different diameters.

In the above cases, the light receiving region and the at least one groove may be covered with a resin film before the mold is filled with the molding resin.

In the above cases, in the step of forming the at least one groove, the resin layer may be allowed to remain on the upper surface of the substrate in a region surrounding the at least one groove.

In the above cases, the resin layer may be formed with a polyimide resin.

A semiconductor device according to another embodiment of the present invention includes a substrate including a photodiode; a resin layer formed on an upper surface of the substrate, the resin layer not covering a light receiving region of the photodiode, the resin layer including at least one groove surrounding the light receiving region; and a molding resin portion formed by mold-sealing the photodiode with the resin layer thereon so as not to cover the light receiving region.

A semiconductor device according to still another embodiment of the present invention includes a substrate including a plurality of semiconductor elements including a photodiode; a resin layer formed on an upper surface of the substrate, the resin layer not covering a light receiving region of the photodiode, the resin layer including at least one groove surrounding the light receiving region; and a molding resin portion formed by mold-sealing the semiconductor elements with the resin layer thereon so as not to cover the light receiving region.

The present invention can provide a semiconductor device that includes a photodiode with high sensitivity to light and a method for manufacturing the semiconductor device in a high yield.

BRIEF DESCRIPTION OF THE DRAWINGS

FIGS. 1A, 1B, 1C, and 1D are explanatory views showing steps in manufacturing a semiconductor device according to an embodiment of the present invention;

FIGS. 2A, 2B, 2C, and 2D are explanatory views showing steps in manufacturing a semiconductor device according to an embodiment of the present invention;

DESCRIPTION OF THE PREFERRED EMBODIMENTS

Hereinafter, a method for manufacturing a semiconductor device according to an embodiment of the present invention and a semiconductor device manufactured by the method will be specifically described with reference to FIGS. 1A to 5C.

The embodiment described below is an example in which the present invention is applied to a manufacturing step where a photo detector integrated circuit (PDIC) having semiconductor elements including a photodiode on a single semiconductor substrate is packaged with a sealing resin. The present invention is not restricted to the embodiment. The present invention is applicable to any packaging step in which a semiconductor element is sealed with a resin or the like such that the semiconductor element is not entirely covered with the resin or the like. Such a packaging step may include a packaging step in which a single semiconductor element having a light receiving region is sealed with a resin or the like such that the light receiving region is not covered with the resin or the like.

Note that the embodiment is described in terms of a packaging step in which a PDIC is sealed with a resin. For other steps for forming the PDIC performed prior to the packaging step, existing manufacturing steps may be used. Thus, such steps are not described below.

Figure 2A:
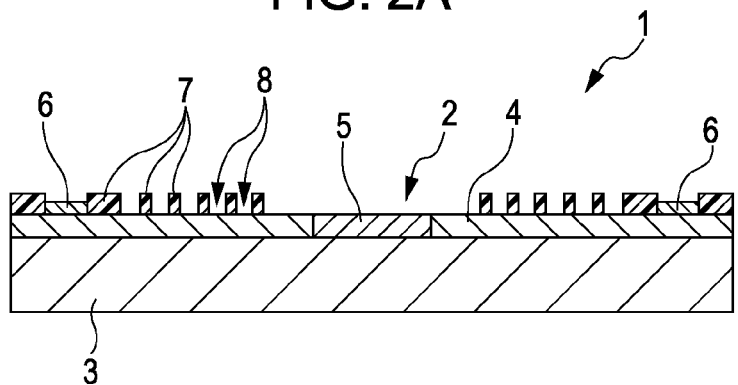
Figure 2B:
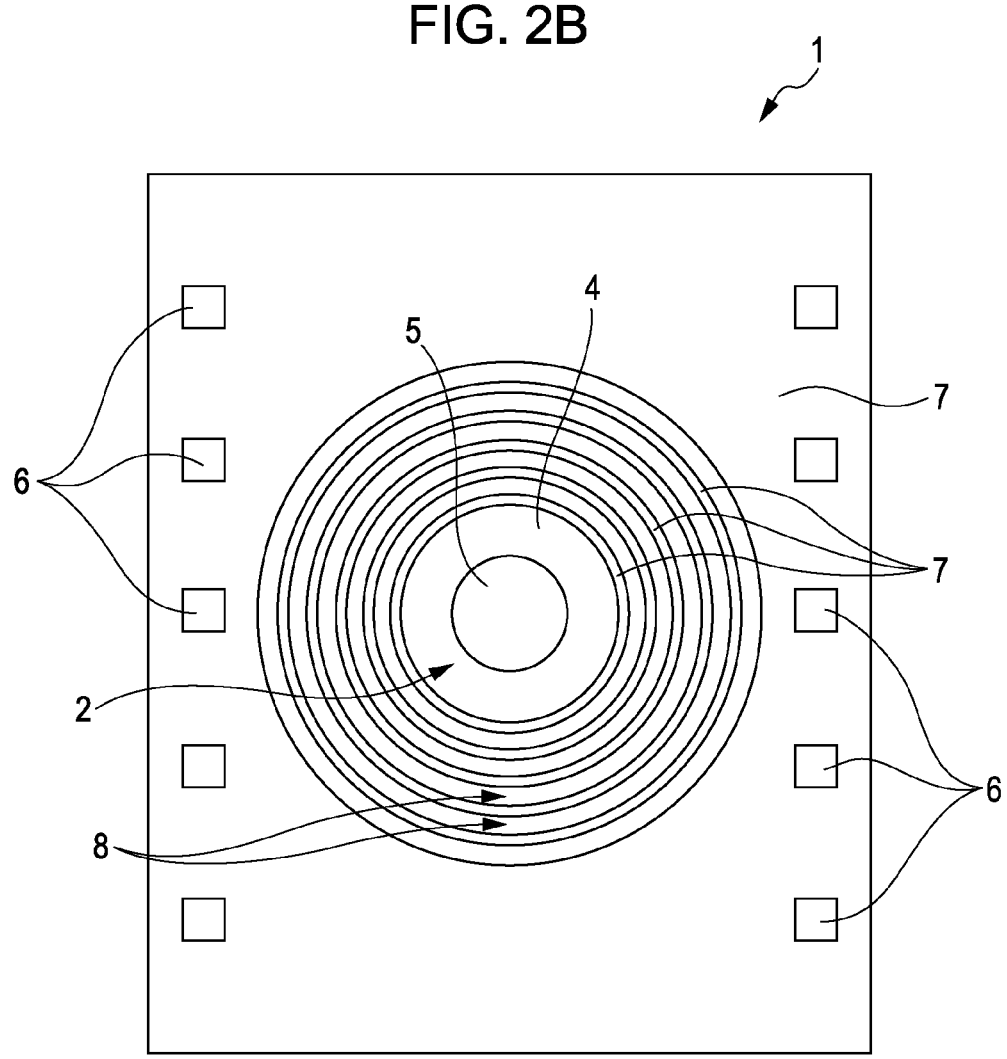

FIGS. 1A, 1C, 2A, 2C, 3A, 3B, 4, 5A, and 5B are explanatory views showing cross sections of configurations in steps for manufacturing a semiconductor device according to the embodiment. FIG. 1B is an explanatory view, in plan, of the configuration in FIG. 1A. FIG. 1D is an explanatory view, in plan, of the configuration in FIG. 1C. FIG. 2B is an explanatory view, in plan, of the configuration in FIG. 2A. FIG. 2D is an explanatory view, in plan, of the configuration in FIG. 2C. FIG. 5C is an explanatory view, in perspective, of a semiconductor device manufactured by the method according to the embodiment.

Manufacturing of a semiconductor device (hereinafter, referred to as "PDIC") in FIG. 5C is described below. As shown in FIGS. 1A and 1B, a structure (hereinafter, referred to as "chip 1") is prepared that includes, on a single semiconductor substrate 3, a photodiode 2 formed by existing manufacturing steps and other semiconductor elements (not shown) such as transistors, metal insulator semiconductor (MIS) capacitive elements, and polysilicon resistors. Electrode pads 6 in FIGS. 1A and 1B function as the anode electrode and the cathode electrode of the photodiode 2.

As shown in FIG. 1A, the chip 1 has a light receiving region 5 of the photodiode 2 in a substantially central portion of the front surface of the chip 1. As shown in FIG. 1B, the light receiving region 5 is circular in plan view.

A multilevel interconnection layer 4 including wires interconnecting semiconductor elements on the chip 1 in accordance with the design of the chip 1 is formed around the light receiving region 5.

As shown in FIGS. 1C and 1D, a resin layer 7 is then formed with a polyimide resin on the entirety of the upper surface of the semiconductor substrate 3 including the photodiode 2.

Specifically, the resin layer 7 is formed as follows. A pretreatment agent is spin-coated over the entirety of the upper surface of the chip 1 by adding dropwise the pretreatment agent onto the light receiving region 5 of the photodiode 2 while the chip 1 is being rotated at a certain rate.

Likewise, a polyimide resin is then spin-coated over the thus-formed pretreatment agent layer of the chip 1 by adding dropwise the polyimide resin onto the chip 1 while the chip 1 is being rotated at a certain rate. Thus, the resin layer 7 is formed so as to have a thickness of 5 to 15 µm.

In the present embodiment, the resin layer 7 is formed with a polyimide resin that blocks light when being cured.

A resist mask (not shown) is then formed on the resin layer 7 by applying a photoresist onto the resin layer 7 and patterning the thus-formed photoresist layer by photolithography techniques.

After that, the resin layer 7 is wet-etched through the resist mask, so that portions of the resin layer 7 that are not covered with the resist mask are selectively removed. As a result, as shown in FIGS. 2A and 2B, there are formed an opening through which the surface of the light receiving region 5 is exposed and grooves 8 in the resin layer 7. The grooves 8 are formed so as to surround the light receiving region 5.

Alternatively, the opening, the grooves 8, and the like may be formed without a resist mask by adding a sensitizer to a polyimide resin to prepare an optically sensitive polyimide resin, forming the resin layer 7 with the optically sensitive polyimide resin, and subjecting the resin layer 7 to a certain pattern exposure treatment.

As shown in FIG. 2B, the grooves 8 are formed as five closed-loop grooves that surround the light receiving region 5. Although the number of the grooves 8 is five in the present embodiment, the present invention is not restricted thereto. At least one groove is formed as the groove 8 and preferably five or more grooves are formed as the grooves 8.

The grooves 8 are formed to have a width of about 20 µm and at a pitch of about 20 µm.

As fully described below, the grooves 8 function as dams for preventing a sealing resin from flowing into the light receiving region 5 of the photodiode 2 when the PDIC is mold-sealed with the sealing resin.

As shown in FIG. 2B, the grooves 8 are formed so as to be concentric circular grooves, in plan view, having different diameters with the center of the grooves being at the center of the light receiving region 5 of the photodiode 2.

Since the grooves 8 are circular in plan view, the grooves 8 can prevent a resin from flowing into the light receiving region 5 from any direction in a mold-sealing step performed later.

Although the grooves 8 are circular in plan view in the present embodiment, any shape will suffice as long as the grooves 8 are closed-loops in plan view such as rectangles or polygons.

When the grooves 8 are formed to be polygons in plan view, the resist mask can be formed to have a less complex pattern on the resin layer 7.

When the grooves 8 are formed, the resin layer 7 is removed in a portion on the light receiving region 5 of the photodiode 2, portions where the grooves 8 are formed, and portions on the electrode pads 6 on the chip 1. The resin layer 7 is not removed other than these portions and left on the multilevel interconnection layer 4.

That is, in the present embodiment, the semiconductor elements other than the photodiode 2 are covered by the resin layer 7.

As described above, the resin layer 7 blocks light. In the configuration where the resin layer 7 covers the semiconductor elements other than the photodiode 2, the resin layer 7 prevents unwanted light through regions other than the light receiving region 5 from entering the light receiving region 5. As a result, the photodiode 2 can exhibit an enhanced sensitivity to light.

The chip 1 is then subjected to a curing treatment for about 2 hours at a temperature of about 350° C., so that the resin layer 7 is cured. As a result, properties of the resin layer 7 such as mechanical strength, heat resistance, and chemical resistance are enhanced.

The chip 1 is then subjected to an ashing treatment for removing residues generated in the formation of the resin layer 7. After that, the back surface of the chip 1 is polished by chemical mechanical polishing (CMP) so that the thickness of the semiconductor substrate 3 is adjusted (not shown).

As shown in FIGS. 2C and 2D, die bonding is conducted by fixing the chip 1, which includes the grooves 8 in the resin layer 7, on a lead frame 10 through an adhesive layer 11. After that, wire bonding is conducted by bonding the electrode pads 6 on the chip 1 to electrode pads 12 on the lead frame 10 with metal wires 13.

Figure 3A:
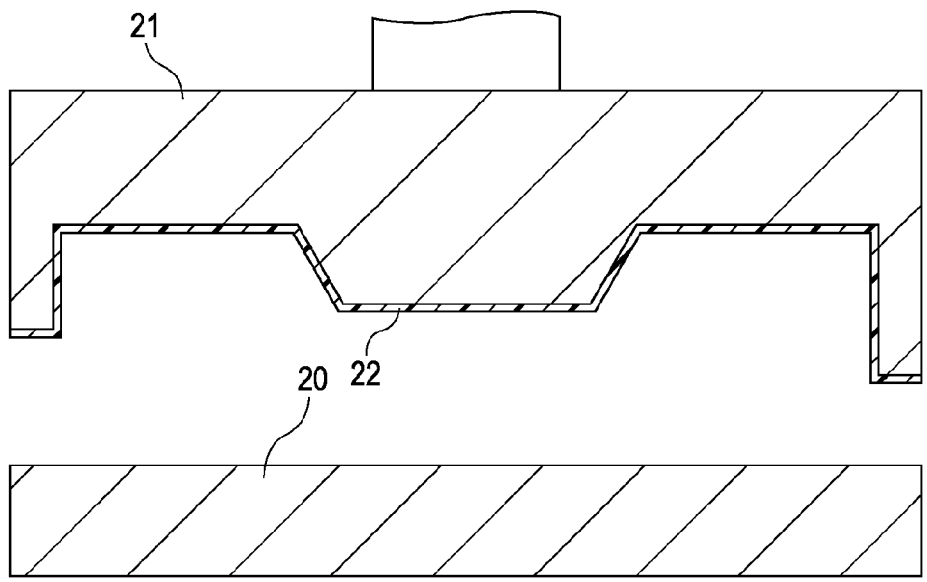
FIGS. 3A and 3B are explanatory views showing steps in manufacturing a semiconductor device according to an embodiment of the present invention.

As shown in FIG. 3A, a resin film 22 with a certain elasticity is attached to the inner surface of a mold 21 for mold-sealing the chip 1. A platform 20 in FIG. 3A is used for placing the chip 1 thereon when the chip 1 is mold-sealed.

Figure 3B:
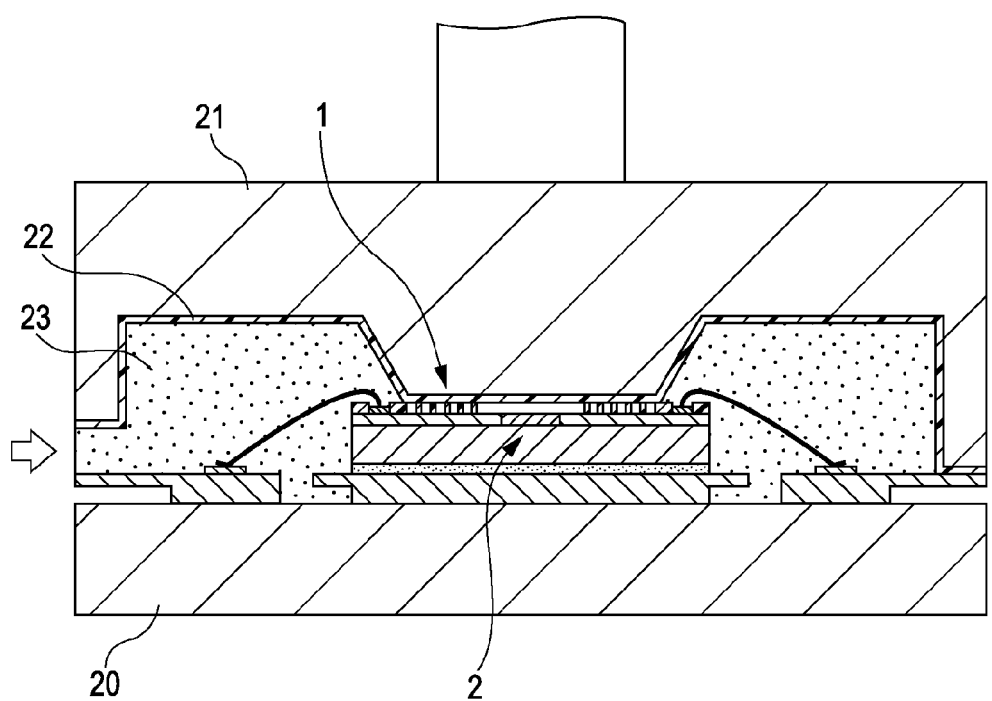

As shown in FIG. 3B, the chip 1, which is fixed to the lead frame 10, is placed on the platform 20; and the mold 21 is then lowered such that a projected portion in the center of the inner surface of the mold 21 is pressed against, through the resin film 22, the light receiving region 5 of the photodiode 2 and the portion including the grooves 8 surrounding the light receiving region 5.

In this way, the light receiving region 5 and the grooves 8 are covered by the resin film 22 prior to filling of the mold 21 with a molding resin 23.

In this case, the projected portion in the center of the inner surface of the mold 21 is pressed against the upper surface of the chip 1. In the present embodiment, the resin film 22 with a certain elasticity, which is attached to the inner surface of the mold 21 in advance, functions as a buffer and prevents the projected portion from coming into direct contact with and damaging the light receiving region 5.

After that, as shown in FIG. 3B, the periphery of the chip 1 is mold-sealed such that the light receiving region 5 is not covered by the molding resin 23. Specifically, the space defined by the inner surface of the mold 21 and the periphery of the chip 1 is filled with the molding resin 23 (e.g. an epoxy resin) liquefied by heating. The molding resin 23 is introduced into the space through an inlet disposed at a lower periphery of the chip 1.

Figure 4:
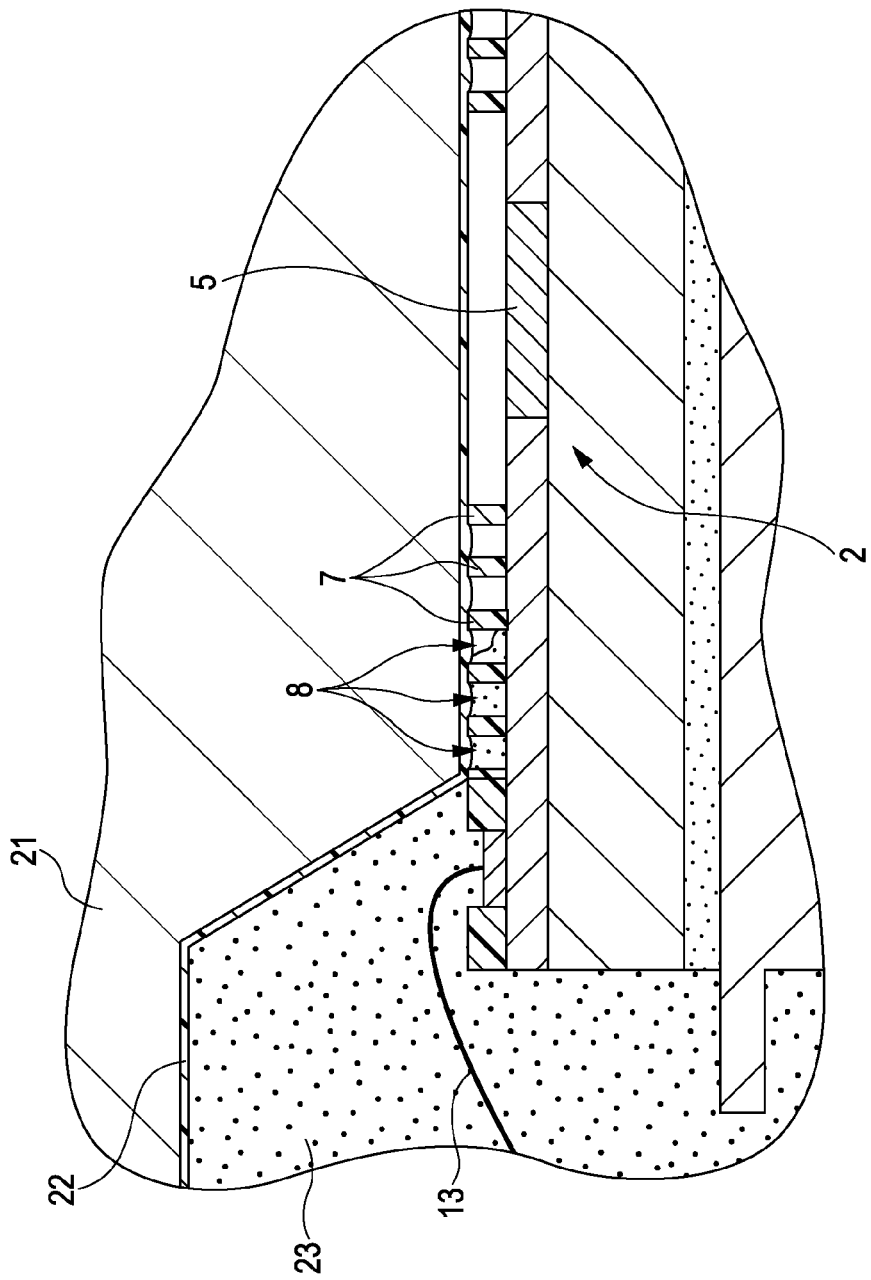
FIG. 4 is an explanatory view showing a step in manufacturing a semiconductor device according to an embodiment of the present invention.

FIG. 4 is an enlarged explanatory view showing a portion including the light receiving region 5 and the grooves 8 in this mold-sealing step.

As shown in FIG. 4, when the mold 21 is filled with the molding resin 23 in the mold-sealing step, the molding resin 23 is subjected to a pressure and a portion of the molding resin 23 can flow for the light receiving region 5 through the gap between the resin layer 7 and the resin film 22.

When the molding resin 23 reaches the light receiving region 5, the area of the light receiving region 5 is decreased and as a result the photodiode 2 can have a degraded sensitivity to light. However, as described above, in the method for manufacturing a semiconductor device according to the present embodiment, the plurality of grooves 8 are formed in the resin layer 7 so as to surround the light receiving region 5, the resin layer 7 being formed on the multilevel interconnection layer 4 of the chip 1. This configuration satisfactorily prevents the molding resin 23 flowing for the light receiving region 5 from reaching the light receiving region 5.

Specifically, when pressure is applied to the molding resin 23 so that the mold 21 is filled with the molding resin 23, the molding resin 23 flows into the region where the grooves 8 are formed from the circumference of this region toward the inner portion of the region. At this time, the grooves 8 function as dams for receiving the molding resin 23 flowing for the light receiving region 5 and the resin layer 7 inbetween the grooves 8 functions as walls for blocking the molding resin 23 flowing for the light receiving region 5. In this way, the molding resin 23 is satisfactorily prevented from reaching the light receiving region 5.

In filling of the mold 21 with the molding resin 23, the resin film 22 with a certain elasticity is disposed between the grooves 8 and the projected portion in the center of the inner surface of the mold 21. The elasticity of the resin film 22 can absorb a portion of the pressure applied to the molding resin 23. This also suppresses flowing of the molding resin 23 into the light receiving region 5.

When the mold 21 is filled with the molding resin 23, which is liquefied by heating, the heat of the molding resin 23 is transferred to the chip 1. However, in the present embodiment, the resin layer 7 formed with a polyimide resin having a good heat resistance covers the multilevel interconnection layer 4 of the chip 1 except the light receiving region 5 of the photodiode 2, the region where the grooves 8 are formed, and the region where the electrode pads 6 are formed. The resin layer 7 protects the multilevel interconnection layer 4 and the semiconductor elements under the layer 4 from the heat of the molding resin 23. As a result, the product yield can be increased.

Since the resin layer 7 formed with a polyimide resin has a coefficient of expansion as low as those of metals, contact with the heated molding resin 23 causes negligible expansion or deformation of the resin layer 7.

As a result, filling the mold 21 with the molding resin 23 at a high temperature does not result in problems such as disconnection of wires in the underlying multilevel interconnection layer 4 caused by thermal expansion and deformation of the resin layer 7. Thus, a decrease in the product yield can be prevented.

Figure 5A:
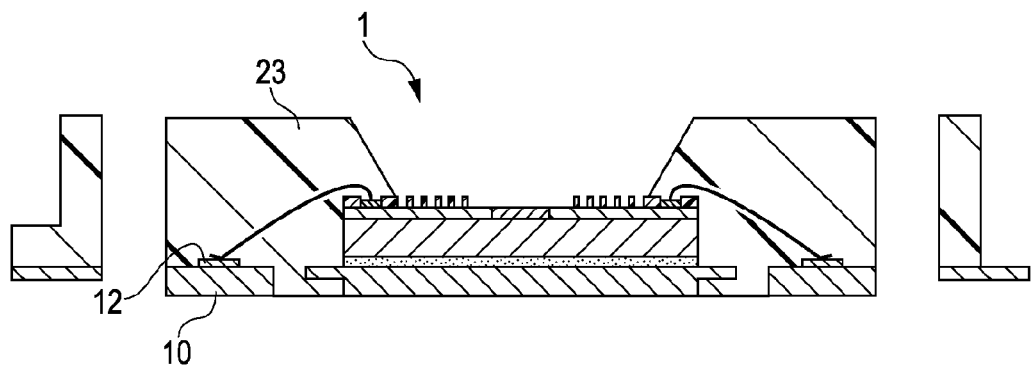
FIGS. 5A, 5B, and 5C are explanatory views showing steps in manufacturing a semiconductor device according to an embodiment of the present invention.

As shown in FIG. 5A, the mold-sealed chip 1 is then detached from the mold 21 and diced into PDICs.

Figure 5B:
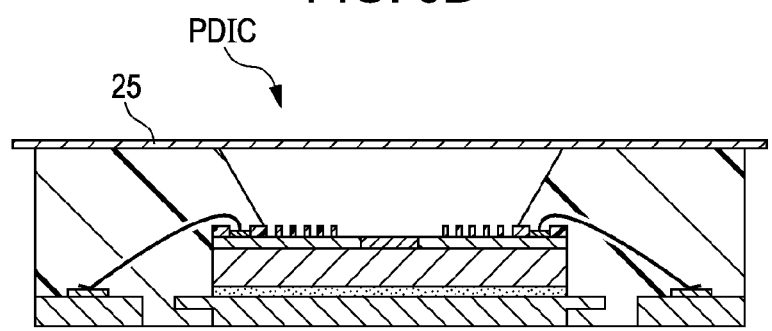
Figure 5C:
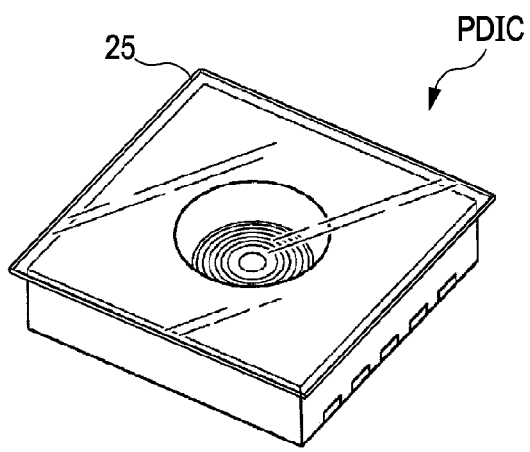

Finally, as shown in FIG. 5B, to prevent dust or the like from adhering to the light receiving region 5 of the photodiode 2 during transportation or mounting of the PDICs, a protective film 25 is attached to the upper surface of each PDIC. Thus, the PDIC shown in FIG. 5C is obtained.

In summary, in the present embodiment, PDICs are manufactured by a method for manufacturing a semiconductor device, including the steps of: forming a resin layer on an upper surface of a substrate including a photodiode; forming, in the resin layer, an opening through which a surface of a light receiving region of the photodiode is exposed; forming at least one groove in the resin layer so as to surround the light receiving region; and subsequently mold-sealing the photodiode by loading the substrate into a mold and filling the mold with a molding resin. In the mold-sealing step, the molding resin with which the mold is filled can be prevented from flowing into the light receiving region of the photodiode.

As a result, a decrease in light sensitivity of a PDIC caused by flowing of the molding resin into the light receiving region can be prevented. Thus, the product yield can be increased.

In the present embodiment, a plurality of concentric circular grooves having different diameters are formed. In this configuration, even if an outer groove does not hold back the molding resin, inner grooves can hold back the molding resin.

In the present embodiment, since the light receiving region and the grooves are covered by the resin film prior to filling the mold with the molding resin, the resin film prevents the mold from coming into direct contact with and damaging the PDIC in the mold-sealing step.

In the present embodiment, in the step of forming the grooves, the resin layer is allowed to remain on the upper surface of the substrate in a region surrounding the grooves. In this configuration, the resin layer protects the PDIC from the heat of the heated molding resin.

As a result, degradation of the characteristics of the PDIC caused by the heat of the molding resin can be prevented. Thus, the product yield can be increased.

In the present embodiment, the resin layer is formed with a polyimide resin having an extremely low thermal expansion coefficient. The polyimide resin, after being cured, also exhibits high mechanical strength, high heat resistance, high chemical resistance, and the capability of blocking light. As a result, the resin layer can protect the PDIC from various stresses applied during the manufacturing steps, and hence, the product yield can be further increased.

Use of the method for manufacturing a semiconductor device according to the present embodiment can provide a PDIC including a substrate including a plurality of semiconductor elements including a photodiode; a resin layer formed on an upper surface of the substrate, the resin layer not covering a light receiving region of the photodiode, the resin layer including at least one groove surrounding the light receiving region; and a molding resin portion formed by mold-sealing the semiconductor elements with the resin layer thereon so as not to cover the light receiving region.

In the method, the molding resin used in the mold-sealing does not adhere to the light receiving region of the photodiode, and hence, the area of the light receiving region is not decreased. Thus, the resulting PDIC can have a high sensitivity to light. Furthermore, there is less variation in sensitivity to light among the PDICs, and hence, the product yield can be enhanced.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
    a substrate including (a) a photodiode having a light receiving region, (b) an interconnection wiring layer around the light receiving region, and (c) electrode pads on an upper surface of the interconnection wiring layer;
    an organic layer on an upper surface of the interconnection wiring layer, the organic layer not covering the light receiving region of the photodiode and not covering the electrode pads, the organic layer including (i) a groove continuously surrounding the light receiving region and (ii) portions that expose the electrode pads, the organic layer being disposed around the electrode pads; and
    a molding resin portion over the substrate with the organic layer thereon so that the molding resin portion does not cover the light receiving region.

2. The semiconductor device of claim 1, further comprising a protective film in contact with the molding resin portion, the protective film covering the light receiving region.

3. The semiconductor device of claim 1, wherein the organic layer comprises a polyimide resin.

4. The semiconductor device of claim 1, further comprising:
    a plurality of grooves continuously surrounding the light receiving region.

5. The semiconductor device of claim 4, wherein the plurality of grooves are closed-loop grooves.

6. The semiconductor device of claim 1, wherein the groove is between the light receiving region and the electrode pads.

7. A semiconductor device comprising a substrate including a plurality of semiconductor elements, at least one of which includes:
    (a) a photodiode having a light receiving region, (b) an interconnection wiring layer around the light receiving region, and (c) electrode pads on an upper surface of the interconnection wiring layer;
    an organic layer on the upper surface of the interconnection wiring layer, the organic layer not covering the light receiving region of the photodiode and not covering the electrode pads, the organic layer including (i) a groove continuously surrounding the light receiving region and (ii) portions that expose the electrode pads, the organic layer being disposed around the electrode pads; and
    a molding resin portion over the substrate with the organic layer thereon so that the molding resin portion does not cover the light receiving region.

8. The semiconductor device of claim 7, wherein the interconnection wiring layer is a multilevel interconnection wiring layer that includes wires interconnecting the plurality of semiconductor elements on the substrate.

* * * * *